United States Patent
Kosakai et al.

(10) Patent No.: US 9,343,346 B2
(45) Date of Patent: May 17, 2016

(54) ELECTROSTATIC CHUCK APPARATUS

(75) Inventors: Mamoru Kosakai, Tokyo (JP); Kazunori Ishimura, Tokyo (JP); Takashi Satou, Tokyo (JP); Ryuuji Hayahara, Tokyo (JP); Takeshi Watanabe, Tokyo (JP); Yoshiaki Moriya, Tokyo (JP); Kei Furuuchi, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 550 days.

(21) Appl. No.: 13/575,545

(22) PCT Filed: Jan. 28, 2011

(86) PCT No.: PCT/JP2011/051756
§ 371 (c)(1),
(2), (4) Date: Jul. 26, 2012

(87) PCT Pub. No.: WO2011/093451
PCT Pub. Date: Aug. 4, 2011

(65) Prior Publication Data
US 2012/0299253 A1 Nov. 29, 2012

(30) Foreign Application Priority Data

Jan. 29, 2010 (JP) .................................. 2010-018210
Sep. 28, 2010 (JP) .................................. 2010-216823

(51) Int. Cl.
*H05B 3/68* (2006.01)
*H01L 21/683* (2006.01)
*H01L 21/67* (2006.01)

(52) U.S. Cl.
CPC ...... *H01L 21/6831* (2013.01); *H01L 21/67103* (2013.01); *Y10T 279/23* (2015.01)

(58) Field of Classification Search
CPC .................. H01L 21/67103; H01L 21/6831
USPC ............ 219/443.1, 444.1; 118/724, 725, 728; 361/234
See application file for complete search history.

(56) References Cited

U.S. PATENT DOCUMENTS 6,094,334 A * 7/2000 Bedi et al. ...................... 361/234
6,490,146 B2 * 12/2002 Wang et al. ..................... 361/234

(Continued)

FOREIGN PATENT DOCUMENTS

JP 63-283037 A 11/1988
JP 05-347352 A 12/1993

(Continued)

OTHER PUBLICATIONS

International Search Report issued in International Patent Application No. PCT/JP2011/051756, mailed Apr. 19, 2011, 6 pages.

(Continued)

*Primary Examiner* — Sang Y Paik
(74) *Attorney, Agent, or Firm* — Wood, Herron & Evans, LLP

(57) ABSTRACT

An electrostatic chuck apparatus including: an electrostatic chuck section having one main surface that is a mounting surface on which a plate specimen is mounted, and being equipped with an electrostatic adsorbing internal electrode; and a temperature adjusting base section that adjusts the electrostatic chuck section to a desired temperature, wherein a heating member is bonded to a main surface of the electrostatic chuck section, which is opposite to the mounting surface, via an adhesive material, the whole or a part of the main surface of the temperature adjusting base section, which is on the side of the electrostatic chuck section, is covered with a sheet or film of insulating material, and the electrostatic chuck section bonded with the heating member and the temperature adjusting base section covered with the insulating material are bonded and integrated via an insulating organic adhesive layer formed by curing a liquid adhesive.

8 Claims, 4 Drawing Sheets

(56) References Cited

U.S. PATENT DOCUMENTS

| | | | |
|---|---|---|---|
| 6,838,646 B2 * | 1/2005 | Inazumachi et al. | 219/444.1 |
| 7,274,004 B2 * | 9/2007 | Benjamin et al. | 219/444.1 |
| 2004/0261946 A1 | 12/2004 | Endoh et al. | |
| 2005/0274321 A1 | 12/2005 | Ukei et al. | |

FOREIGN PATENT DOCUMENTS

| | | |
|---|---|---|
| JP | 08-148549 A | 6/1996 |
| JP | 2003-142567 A | 5/2003 |
| JP | 2003258065 A | 9/2003 |
| JP | 2005277074 A | 10/2005 |
| JP | 2006127900 A | 5/2006 |
| JP | 2007-194320 A | 8/2007 |
| JP | 2007251124 A | 9/2007 |
| JP | 2008527694 A | 7/2008 |
| JP | 2008300491 A | 12/2008 |

OTHER PUBLICATIONS

The State Intellectual Property Office of the People's Republic of China, Notification of First Office Action issued in corresponding Chinese Patent Application No. 201180007703.1 and English-language translation issued Sep. 16, 2014.

Japanese Patent Office, Notice of Reasons for Rejection issued in corresponding Japanese Patent Application No. 2013-246024 and English translation mailed Sep. 24, 2014 (8 pages).

\* cited by examiner

ELECTROSTATIC CHUCK APPARATUS

TECHNICAL FIELD

The present invention relates to an electrostatic chuck apparatus, more specifically, to an electrostatic chuck apparatus which is suitably used when adsorbing and fixing a plate specimen such as a semiconductor wafer through electrostatic force, is able to enhance the uniformity of in-plane temperature in a mounting surface with the plate specimen mounted thereon and is able to enhance the voltage endurance of a heating member, even in each process such as a film forming processing using a physical vapor deposition method (PVD) and a chemical vapor deposition method (CVD) in a semiconductor manufacturing process, an etching processing such as a plasma etching, and an exposure processing.

This application claims priority to and the benefit of Japanese Patent Application No. 2010-018210 filed on Jan. 29, 2010, and Japanese Patent Application No. 2010-216823 filed on Sep. 28, 2010, the contents of which are incorporated herein by reference.

BACKGROUND ART

In recent years, in the semiconductor manufacturing process, along with the increasing density and increasing performance of devices, further improvements to micromachining technology have been desired. The etching technology of the semiconductor manufacturing process is one important micromachining technology. Recently, in etching technology, a plasma etching technology which allows the high efficiency micromachining and a large area has become mainstream.

The plasma etching technology is a kind of dry etching technology. Specifically, the technology forms a mask pattern using a resist on a solid material becoming a machining target, introduces a reactive gas into a vacuum in a state of supporting the solid material in the vacuum, causes accelerated electrons to collide with gas molecules and become a plasma by applying a high frequency electric field to the reactive gas, and forms a micro pattern in the solid material by reacting the radicals (free radicals) and the ions generated from the plasma with the solid material to eliminate them as a reaction product.

Meanwhile, there is a plasma CVD method as a thin film growth technology which combines a raw material gas by the action of the plasma and deposits the obtained composition on a substrate. This method is a film forming method of discharging the plasma by applying a high frequency electric field to the gas containing the raw material molecules, decomposing the raw material molecules by the electrons accelerated by the plasma discharging, and depositing the obtained composition. A reaction, which did not occur only through thermal excitation at a low temperature, is also possible because the gases in the system collides with each other, is activated and becomes the radical in the plasma gas.

In a semiconductor manufacturing apparatus using the plasma such as a plasma etching apparatus and a plasma CVD apparatus, an electrostatic chuck apparatus has been used as an apparatus which simply attaches and fixes a wafer to a specimen stage, and maintains the wafer to a desired temperature.

However, in the plasma etching apparatus of the related art, when irradiating the wafer fixed to the electrostatic chuck apparatus with plasma, the surface temperature of the wafer rises. Thus, in order to suppress the rise in the surface temperature of the wafer, a cooling medium such as water is circulated in a temperature adjusting base section of the electrostatic chuck apparatus to cool the wafer from the lower side. However, at this time, a temperature distribution is generated in the surface of the wafer. For example, the temperature is increased in the center section of the wafer, and the temperature is lowered at the edge section thereof.

Furthermore, a difference is generated in the in-plane temperature distribution of the wafer due to differences in the structure and method of the plasma etching apparatus.

Thus, an electrostatic chuck apparatus with a heater function has been suggested in which a heater member is attached between the electrostatic chuck section and the temperature adjusting base section (Patent Document 1).

The electrostatic chuck apparatus with the heater function can locally make a temperature distribution in the wafer. Thus, by setting the in-plane temperature distribution of the wafer according to the film deposition speed and the plasma etching speed, it is possible to effectively perform a local film formation, such as a pattern formation, on the wafer and local plasma etching.

As a method of attaching a heater to the electrostatic chuck apparatus, there are a method of building the heater into an electrostatic chuck made of ceramic, a method of attaching the heater by applying a heater material to the back side of an adsorption surface of the electrostatic chuck, that is, the back surface of a ceramic plate-like body using a screen printing method by a predetermined pattern to perform thermal curing, a method of attaching the heater by gluing a metal foil or a sheet-like conductive material to the back surface of the ceramic plate-like body or the like.

Moreover, an electrostatic chuck apparatus with a heater function is obtained by bonding and integrating the electrostatic chuck section with the heater built therein or attached thereto and the temperature adjusting heater section by the use of an organic adhesive.

PRIOR DOCUMENTS

Patent Document

[Patent Document 1] Japanese Unexamined Patent Application, First Publication No. 2008-300491

SUMMARY OF INVENTION

Technical Problem

However, in the electrostatic chuck apparatus with the heater function using the method of attaching the heater by applying the heater material to the back side of the adsorption surface of the electrostatic chuck, that is, the back surface of the ceramic plate-like body using a screen printing method by a predetermined pattern to perform a thermal curing, or a method of attaching the heater by gluing a metal foil or a sheet-like conductive material to the back surface of the ceramic plate-like body of the related art mentioned above, in a case where the electrostatic chuck section and the temperature adjusting base section are bonded and integrated by the use of the organic adhesive, when a micro hole called a pore is generated in the organic adhesive layer or a non-bonded section called cissing is generated between the organic adhesive layer, and the electrostatic chuck section and the temperature adjusting base section, in a case of applying the voltage to the heater, there has been a problem in that the electrostatic chuck section and the temperature adjusting base section are conduct with each other (short-circuit defect), and an insulation breakdown may be generated.

Furthermore, in a case of securing the insulating properties through the thickness of the organic adhesive layer, since it is difficult to make the thickness of the organic adhesive layer thin and variations occur in the thickness of the organic adhesive layer, there has been a problem in that the in-plane temperature of the surface of the electrostatic chuck section with the wafer mounted thereon cannot be made sufficiently uniform.

In the electrostatic chuck apparatus with the heater function using the metal foil or the sheet-like conductive material, in a case where a difference in level is generated between a section to which the metal foil or the sheet-like conductive material are glued as a heater pattern and a section with no heater pattern, and the apparatus is bonded to the cooling base only by the sheet-like adhesive, there has been a problem in that concave and convex sections of the heater cannot be covered and holes or the like may be generated in the adhesive layer. Furthermore, even in a case of using the thermoplastic sheet-like adhesive, there has been a problem in that holes are generated at the boundary between a section with a heater and a section with no heater, there is a risk of discharging and peeling-off, and control properties of the in-plane temperature distribution of the electrostatic chuck due to the heat conduction variation between the heater and the cooling base are lowered.

The present invention has been made in view of the above circumstances, and an object thereof is to provide an electrostatic chuck apparatus which is able to prevent the insulation breakdown between the electrostatic chuck section and the temperature adjusting base section, improve the voltage endurance, improve the regularity of the in-plane temperature of a mounting surface of a plate specimen of the electrostatic chuck section, and improve the voltage endurance of the heating member provided in the electrostatic chuck section by more regularly applying the voltage between the electrostatic chuck section and the temperature adjusting base section.

Solution to Problem

As a result of intensive studies in order to solve the above problems, the present inventors know that, if a thin heating member is bonded to a main surface of an opposite side of a mounting surface of the electrostatic chuck section via an adhesive, the whole or a part of the surface of the electrostatic chuck section side of the temperature adjusting base section is covered with a sheet-like or film-like insulating material, and the electrostatic chuck section and the temperature adjusting base section are bonded and integrated via an insulating organic adhesive layer formed by curing a liquid adhesive, it is possible to prevent the insulation breakdown between the electrostatic chuck section and the temperature adjusting base section and improve the voltage endurance, it is possible to improve the uniformity of the in-plane temperature of the mounting surface of the electrostatic chuck section, and the voltage endurance of the heating member can be improved, which leads to the completion of the present invention.

That is, according to a first aspect of the present invention, there is provided an electrostatic chuck apparatus which includes an electrostatic chuck section having one main surface that is a mounting surface on which a plate specimen is mounted, and being equipped with an electrostatic adsorbing internal electrode; and a temperature adjusting base section that adjusts the electrostatic chuck section to a desired temperature, wherein a heating member is bonded to a main surface of the electrostatic chuck section, which is opposite to the mounting surface, via an adhesive material, the whole or a part of the main surface of the temperature adjusting base section, which is on the side of the electrostatic chuck section, is covered with a sheet-like or film-like insulating material, and the electrostatic chuck section bonded with the heating member and the temperature adjusting base section covered with the sheet-like or the film-like insulating material are bonded and integrated via an insulating organic adhesive layer formed by curing a liquid adhesive.

In the electrostatic chuck apparatus, by bonding and integrating the electrostatic chuck section and the temperature adjusting base section via the insulating organic adhesive layer formed by curing the liquid adhesive, the insulating organic adhesive layer satisfactorily maintains the insulating between the electrostatic chuck section and the temperature adjusting base section. As a result, there is no concern that a conduction (the short-circuit defects) is generated between the electrostatic chuck section and the temperature adjusting base section, and as a consequence, there is no concern that the insulation breakdown is generated between the electrostatic chuck section and the temperature adjusting base section, and the voltage endurance between them is improved.

Furthermore, by bonding the heating member to the main surface of the opposite side of the mounting surface of the electrostatic chuck section via the adhesive material and covering the whole or a part of the surface of the electrostatic chuck section side of the temperature adjusting base section with the sheet-like or film-like insulating material, a gap between the electrostatic chuck section and the heating member and a gap between the heating member and the temperature adjusting base section are uniformly held, the uniformity of the in-plane temperature in the mounting surface of the electrostatic chuck section is enhanced, and the voltage endurance of the heating member and the temperature adjusting base section is further improved.

Furthermore, by interposing the insulating organic adhesive layer between the electrostatic chuck section bonded with the heating member and the temperature adjusting base section, even in a case of rapidly raising and lowering the temperature of the mounted plate specimen, the organic adhesive layer functions as a shock absorbing layer which alleviates rapid expansion and contraction with respect to the electrostatic chuck section, and prevents cracks, defects or the like from occurring in the electrostatic chuck section, whereby the durability of the electrostatic chuck section is improved.

According to a second aspect of the present invention, the sheet-like or film-like insulating material is bonded the temperature adjusting base section by the sheet-like or film-like adhesive material.

In the electrostatic chuck apparatus, by bonding the sheet-like or film-like insulating material to the temperature adjusting base section by the use of the sheet-like or film-like adhesive material, the insulating properties of the electrostatic chuck section side of the temperature adjusting base section is maintained, and the thickness of the adhesive material is constant, whereby the uniformity of the in-plane temperature in the mounting surface of the electrostatic chuck section is increased.

According to a third aspect of the present invention, the thickness of the electrostatic chuck section is equal to or greater than 0.7 mm and is equal to or less than 3.0 mm.

In the electrostatic chuck apparatus, by making the thickness of the electromagnetic chuck section equal to or greater than 0.7 mm and equal to or less than 3.0 mm, sufficient strength is provided to the electrostatic chuck section, the heat capacity of the electrostatic chuck section itself is reduced, and the heat exchange efficiency and the thermal responsiveness of the mounted plate specimen are also excellent.

According to a fourth aspect of the present invention, the heating member is a thin plate-shaped heater element formed from a nonmagnetic metal having a thickness of 0.2 mm or less.

In the electrostatic chuck apparatus, by making the heating member the thin plate-shaped heater element formed from a nonmagnetic metal having a thickness of 0.2 mm or less, the pattern of the heater element is hardly reflected in the plate specimen, and the in-plane temperature of the plate specimen is easily maintained to a desired temperature pattern.

According to a fifth aspect of the present invention, the adhesive material is a silicone or acrylic adhesive material.

In the electrostatic chuck apparatus, by making the adhesive material a silicone adhesive material or acrylic adhesive material, thermal stress of the electrostatic chuck section and the heater section is reduced, and durability is further improved.

According to a sixth aspect of the present invention, the variation of the thickness of the adhesive material is equal to or less than 10 μm.

In the electrostatic chuck apparatus, by making the variation of the thickness of the adhesive material equal to or less than 10 μm, a gap between the electrostatic chuck section and the heating member is controlled at an accuracy of 10 μm or less, and the uniformity of the in-plane temperature of the plate specimen heated by the heating member is improved.

According to a seventh aspect of the present invention, the electrostatic chuck section includes a mounting plate having one main surface as the mounting surface, a support plate which is integrated with the mounting plate to support the mounting plate, and the electrostatic adsorbing internal electrode provided between the mounting plate and the support plate, wherein the mounting plate is formed from an aluminum oxide-silicon carbide composite sintered body or a yttrium oxide sintered body.

In the electrostatic chuck apparatus, by forming the mounting plate by the aluminum oxide-silicon carbide composite sintered body or the yttrium oxide sintered body, durability relative to a corrosive gas and the plasma thereof is improved, and the mechanical strength is also maintained.

According to an eighth aspect of the present invention, the thickness of the mounting plate is equal to or greater than 0.3 mm and equal to or less than 2.0 mm.

In the electrostatic chuck apparatus, by making the thickness of the mounting plate equal to or greater than 0.3 mm and equal to or less than 2.0 mm, the plate specimen can reliably be adsorbed and fixed. Thus, the plate specimen can be sufficiently heated, and there is no risk of a discharge due to the voltage applied to the electrostatic adsorbing internal electrode.

Advantageous Effects of Invention

According to the electrostatic chuck apparatus of the present invention, the heating member is bonded to another main surface of the electrostatic chuck section via the sheet-like or film-like adhesive, and the electrostatic chuck section bonded with the heating member and the temperature adjusting base section completely or partly covered with the insulating sheet are bonded and integrated via the organic adhesive layer. Thus, it is possible to satisfactorily maintain the insulation between the electrostatic chuck section and the temperature adjusting base section by the insulating member, and as a consequence, the insulation breakdown can be prevented. Thus, it is possible to improve the voltage endurance between the electrostatic chuck section and the temperature adjusting base section.

Furthermore, since the heating member is bonded to another main surface of the electrostatic chuck section via the sheet-like or film-like adhesive, the gap between the electrostatic chuck section and the heating member can be constantly maintained, and the uniformity on the in-plane temperature in the mounting surface of the electrostatic chuck section can be improved. Furthermore, the voltage endurance between the heating member and the temperature adjusting base section can be improved, and even in a case where the temperature adjusting base section is used as a plasma electrode, the higher voltage can be applied to the temperature adjusting base section.

Furthermore, since the organic adhesive layer is interposed between the electrostatic chuck section and the temperature adjusting base section, the organic adhesive layer functions as the shock absorbing layer which alleviates the rapid expansion and contraction with respect to the electrostatic chuck section. Thus, it is possible to prevent cracks, defects or the like from occurring in the electrostatic chuck section, and the durability of the electrostatic chuck section can be improved.

Moreover, since the mounting plate constituting the electrostatic chuck section is formed of an aluminum oxide-silicon carbide composite sintered body or a yttrium oxide sintered body, the durability thereof relative to corrosive gas and plasma of the corrosive gas can be improved, and the mechanical strength can also be sufficiently maintained.

DESCRIPTION OF EMBODIMENTS

An embodiment of the electrostatic chuck apparatus of the present invention will be described based on the drawings.

In addition, the embodiment mentioned below is specifically described in order to more satisfactorily understand the gist of the present invention, and does not limit the present invention unless specifically defined.

Figure 1:
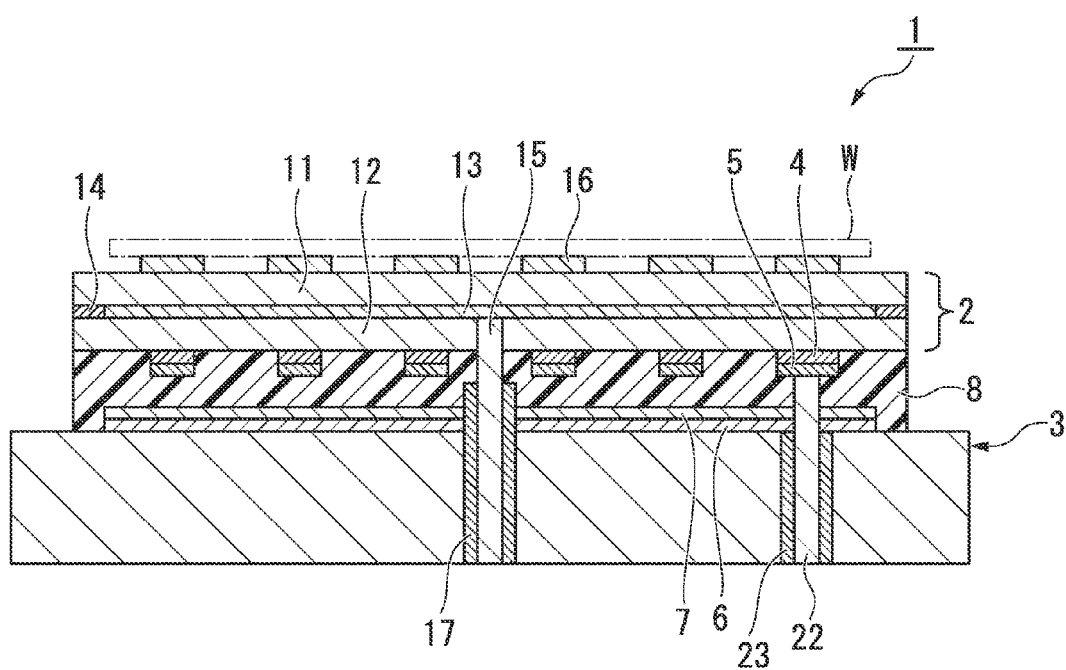
FIG. 1 is a cross-sectional view that shows an electrostatic chuck apparatus of an embodiment of the present invention.

FIG. 1 is a cross-sectional view that shows an electrostatic chuck apparatus of an embodiment of the present invention. An electrostatic chuck apparatus 1 is mainly constituted by a disk-shaped electrostatic chuck section 2, a disk-shaped temperature adjusting base section 3 having a thickness which adjusts the electrostatic chuck section 2 to a desired temperature, an adhesive material 4 having a predetermined pattern bonded to a lower surface (another main surface) of the electrostatic chuck section 2, a heater element 5 of a pattern having the same shape as that of the adhesive material 4 bonded to the lower surface of the adhesive material 4, an insulating member 7 bonded to an upper surface of the temperature adjusting base section 3 via an adhesive material 6, and an organic adhesive layer 8 which bonds and integrates the heater element 5 on the lower surface of the electrostatic chuck section 2 and the insulating member 7 on the temperature adjusting base section 3 in an opposed state.

The electrostatic chuck section 2 is constituted by a mounting plate 11 in which an upper surface thereof is a mounting surface with a plate specimen W such as a semiconductor wafer mounted thereon, a support plate 12 which is integrated with the mounting plate 11 and supports the mounting plate 11, an electrostatic adsorbing internal electrode 13 which is provided between the mounting plate 11 and the support plate 12, an insulating material layer 14 which insulates a periphery of the electrostatic adsorbing internal electrode 13, and a power supplying terminal 15 which is provided so as to pass through the support plate 12 and applies the direct voltage to the electrostatic adsorbing internal electrode 13.

The mounting plate 11 and the support plate 12 have a disk shape similar to a shape of the overlap surface and are formed by an insulating ceramic sintered body such as an aluminum oxide-silicon carbide ($Al_2O_3$—SiC) composite sintered body, an aluminum oxide ($Al_2O_3$) sintered body, an aluminum nitride (AlN) sintered body, and a yttrium oxide ($Y_2O_3$) sintered body which has mechanical strength and has durability relative to a corrosive gas and plasma thereof.

A plurality of protrusion sections 16 having a diameter smaller than the thickness of the plate specimen is formed on the mounting surface of the mounting plate 11, and the protrusion sections 16 have a configuration that supports the plate specimen W.

A total thickness of the mounting plate 11, the support plate 12, the electrostatic adsorbing internal electrode 13, and the insulating material layer 14, that is, the thickness of the electrostatic chuck section 2 is preferably equal to or greater than 0.7 mm and equal to or less than 3.0 mm. When the thickness of the electrostatic chuck section 2 is lower than 0.7 mm, the mechanical strength of the electrostatic chuck section 2 cannot be secured. Meanwhile, when the thickness of the electrostatic chuck section 2 is greater than 3.0 mm, the thermal capacity of the electrostatic chuck section 2 becomes too large, the thermal responsiveness of the mounted plate specimen W is degraded, and due to an increase in heat transfer of the electrostatic chuck section in a transverse direction, it is difficult to keep the in-plane temperature of the plate specimen W to a desired temperature pattern.

Particularly, the thickness of the mounting plate 11 is preferably equal to or greater than 0.3 mm and equal to or less than 2.0 mm. When the thickness of the mounting plate 11 is lower than 0.3 mm, there is a high risk of discharge due to the voltage applied to the electrostatic adsorbing internal electrode 13. Meanwhile, when the thickness of the mounting plate 11 is greater than 2.0 mm, the plate specimen W cannot be sufficiently adsorbed and fixed, and thus it is difficult to sufficiently heat the plate specimen W.

The electrostatic adsorbing internal electrode 13 is used as an electrostatic chuck electrode for generating electric charge to fix the plate specimen by electrostatic force. The shape and the size thereof are suitably adjusted depending on the application thereof.

The electrostatic adsorbing internal electrode 13 is formed by a conductive ceramic such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, and an yttrium oxide-molybdenum ($Y_2O_3$—Mo) conductive composite sintered body or a high melting-point metal such as tungsten (W), tantalum (Ta), and molybdenum (Mo).

Although not particularly limited, the thickness of the electrostatic adsorbing internal electrode 13 is preferably equal to or greater than 0.1 μm and equal to or less than to 100 μm, and more preferably, is equal to or greater than 5 μm and equal to or less than 20 μm. When the thickness of the electrostatic adsorbing internal electrode 13 is lower than 0.1 μm, sufficient conductivity cannot be secured. Meanwhile, when the thickness of the electrostatic adsorbing internal electrode 13 is greater than 100 μm, cracks tend to enter a joint interface between the electrostatic adsorbing internal electrode 13 and the mounting plate 11 and a joint interface between the electrostatic adsorbing internal electrode 13 and the support plate 12 due to a difference in coefficient of thermal expansion between the electrostatic adsorbing internal electrode 13, the mounting plate 11, and the support plate 12.

The electrostatic adsorbing internal electrode 13 having such a thickness can be easily formed by a film forming method such as a sputtering method and a vapor deposition method or a coating method such as a screen printing method.

The insulating material layer 14 surrounds the electrostatic adsorbing internal electrode 13 to protect the electrostatic adsorbing internal electrode 13 from the corrosive gas and the plasma thereof, joins and integrates a boundary section between the mounting plate 11 and the support plate 12, that is, an outer circumferential region other than the electrostatic adsorbing internal electrode 13, and is constituted by an insulating material having the same composition or the same main component as the material constituting the mounting plate 11 and the support plate 12.

The power supplying terminal 15 has a rod shape provided for applying the direct voltage to the electrostatic adsorbing internal electrode 13. The material of the power supplying terminal 15 is not particularly limited if a material has a conductive material having excellent heat resistance, but a material having a coefficient of thermal expansion similar to those of the electrostatic adsorbing internal electrode 13 and the support plate 12 is preferable. For example, a conductive ceramic constituting the electrostatic adsorbing internal electrode 13 or a metallic material such as tungsten (W), tantalum (Ta), molybdenum (Mo) and niobium (Nb) and a Kovar alloy is suitably used.

The power supplying terminal 15 is insulated against the temperature adjusting base section 3 by an insulator 17 having insulating properties.

Moreover, the power supplying terminal 15 is bonded and integrated to the support plate 12, and the mounting plate 11 and the support plate 12 are bonded and integrated by the electrostatic adsorbing internal electrode 13 and the insulating material layer 14 to constitute the electrostatic chuck section 2.

The temperature adjusting base section 3 is for adjusting the electrostatic chuck section 2 to a desired temperature and has a thick disk shape.

As the temperature adjusting base section 3, for example, a water-cooled base or the like formed with a flow path (not shown) for circulating the water therein is preferably used.

The material constituting the temperature adjusting base section 3 is not particularly limited as long as the material is a metal or a composite material containing the metal which has excellent thermal conductivity, electrical conductivity, and workability. For example, aluminum (Al), an aluminum alloy, copper (Cu), a copper alloy, stainless steel (SUS) or the like are preferably used. It is desirable that at least the surface of the temperature adjusting base section 3 exposed to the plasma be subjected to an alumite treatment or be formed with an insulating film such as alumite.

The adhesive material 4 is a sheet-like or film-like adhesive resin such as polyimide resin, silicone resin, and epoxy resin which has thermal resistance and insulating properties and has the same pattern shape as that of a heater element 5 described later. The thickness thereof is preferably 5 µm to 100 µm, and more preferably, 10 µm to 50 µm.

The variation of the in-plane thickness of the adhesive material 4 is preferably within 10 µm. When the variation of the in-plane thickness of the adhesive material 4 is greater than 10 µm, a variation greater than 10 µm is generated in an in-plane gap between the electrostatic chuck section 2 and the heater element 5. As a consequence, the in-plane uniformity of heat transmitted from the heater element 5 to the electrostatic chuck section 2 is lowered, the in-plane temperature in the mounting surface of the electrostatic chuck section 2 is not uniform, and thus this value is unfavorable.

Figure 2:
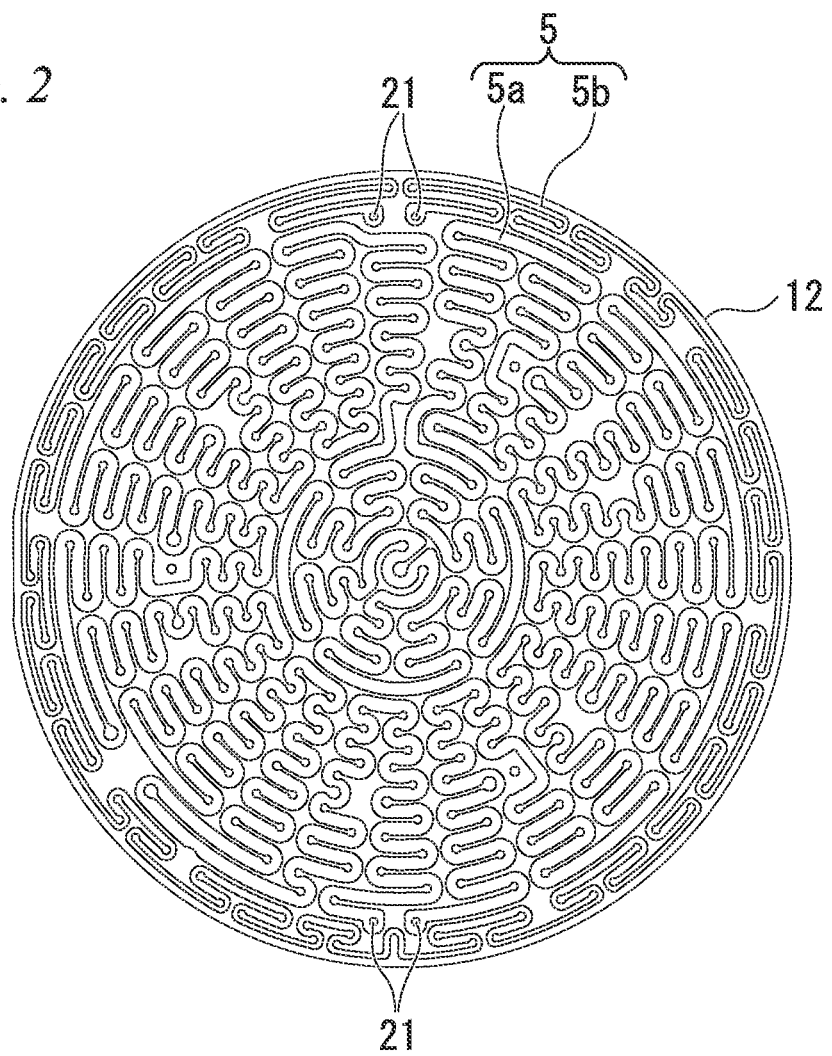
FIG. 2 is a plan view that shows an example of a heater pattern of a heater element in the electrostatic chuck apparatus of an embodiment of the present invention.

The heater element 5 is disposed on a lower surface of the support plate 12 via the adhesive material 4, and, as shown in FIG. 2, includes two heaters independent from each other, that is, an internal heater 5a formed in a center section and an external heater 5b formed at a circumferential edge section of the internal heater 5a so as to surround the internal heater 5a. A power supplying terminal 22 shown in FIG. 1 is connected to a connection position 21 between the power supplying terminals of both end sections of the internal heater 5a and the external heater 5b, and the power supplying terminal 22 is insulated against the temperature adjusting base section 3 by the insulator 23 having the insulating properties.

The internal heater 5a and the external heater 5b make one continuous band-like heater pattern which is obtained by repeatedly placing patterns obtained by meandering a narrow band-like metallic material around the center of the heater 5, and connecting the adjacent patterns to each other.

In the heater element 5, by independently controlling the internal heater 5a and the external heater 5b, respectively, the in-plane temperature distribution of the plate specimen W fixed to the mounting surface of the mounting plate 11 by the electrostatic adsorption is accurately controlled.

The heater pattern of the heater element 5 may be formed by two or more heater patterns independent from each other as mentioned above and may be formed by one heater pattern. However, when the heater element 5 is formed by two or more heater patterns independent from each other like the internal heater 5a and the external heater 5b, by individually controlling the heater patterns independent from each other, the temperature of the plate specimen W during processing can be freely controlled, and thus is preferable.

The heater element 5 is formed by etching a nonmagnetic metallic thin plate having a constant thickness of 0.2 mm or less, preferably 0.1 mm or less, for example, a titanium (Ti) thin plate, a tungsten (W) thin plate, a molybdenum (Mo) thin plate or the like to a desired heater pattern by a photolithography method. When the thickness of the heater element 5 is greater than 0.2 mm, the pattern shape of the heater element 5 is reflected as the temperature distribution of the plate specimen W, and it is difficult to maintain the in-plane temperature of the plate specimen W to a desired temperature pattern.

Furthermore, when forming the heater element 5 from a nonmagnetic metal, even if the electrostatic chuck apparatus 1 is used in a high frequency atmosphere, the heater element does not perform self-heating through high frequency. Accordingly, it is easy to maintain the in-plane temperature of the plate specimen W to a desired constant temperature or a constant temperature pattern and thus is preferable.

Furthermore, when forming the heater element 5 by using the nonmagnetic metallic thin plate of the constant thickness, the thickness of the heater element 5 is constant throughout the heating surface, and the heating value is also constant throughout the heating surface. Thus, the temperature distribution in the mounting surface of the electrostatic chuck section 2 can be equalized.

In the heater element 5, by independently controlling the internal heater 5a and the external heater 5b, the heater pattern of the heater element 5 can be difficult to reflect in the plate specimen W. Thus, it is possible to accurately control the in-plane temperature distribution of the plate specimen W fixed to the mounting surface of the mounting plate 11 by electrostatic adsorption to a desired temperature pattern.

The adhesive material 6 is to bond the insulating member 7 to the upper surface of the temperature adjusting base section 3 and is a sheet-like or film-like adhesive resin having the thermal resistance and the insulating properties such as a polyimide resin, a silicone resin, and an epoxy resin and the like, similar to the adhesive material 4. The thickness thereof is preferably 5 µm to 100 µm, and more preferably, 10 µm to 50 µm.

The variation of the in-plane thickness of the adhesive material 6 is preferably equal to or less than 10 µm. When the variation of the in-plane thickness of the adhesive material 6 is greater than 10 µm, the variation greater than 10 µm is generated in a gap between the temperature adjusting base section 3 and the insulating member 7. As a consequence, the in-plane uniformity of the temperature control of the electrostatic chuck section 2 due to the temperature adjusting base section 3 is lowered, the in-plane temperature in the mounting surface of the electrostatic chuck section 2 is not uniform, and thus this value is unfavorable.

The insulating member 7 is a film-like or sheet-like resin having the insulating properties and the voltage endurance such as a polyimide resin, a silicone resin and an epoxy resin, and the variation of the in-plane thickness of the insulating member 7 is preferably equal to or less than 10 µm. When the variation of the in-plane thickness of the insulating member 7 is greater than 10 µm, a difference between high and low is generated in the temperature distribution by the magnitude of the thickness. As a consequence, the temperature control using the adjustment of the thickness of the insulating member 7 is adversely affected and thus this value is unfavorable.

The thermal conductivity of the insulating member 7 is preferably equal to or greater than 0.05 W/mk and equal to or less than 0.5 W/mk, and more preferably, equal to or greater than 0.1 W/mk and equal to or less than 0.25 W/mk.

When the thermal conductivity is less than 0.1 W/mk, the heat transfer from the electrostatic chuck section 2 to the temperature adjusting base section 3 via the insulating member 7 is difficult, the cooling speed is lowered and thus this value is unfavorable. Meanwhile, when the thermal conductivity is greater than 1 W/mk, the heat transfer from the heater section to the temperature adjusting base section 3 via the insulating member 7 is increased, the temperature rising speed is lowered, and thus this value is unfavorable.

The organic adhesive layer 8 adheres and integrates the heater element 5 bonded to the lower surface of the electrostatic chuck section 2 via the adhesive material 4 and the insulating member 7 bonded onto the temperature adjusting base section 3 via the adhesive material 6 in the opposed state, and has a relaxing action of thermal stress. The thickness of the organic adhesive layer 8 is preferably equal to or greater than 50 µm and equal to or less than 500 µm.

When the thickness of the organic adhesive layer 8 is lower than 50 µm, the thermal conductivity between the electrostatic chuck section 2 and the temperature adjusting base section 3 is satisfactory, but the thermal stress relaxation is insufficient, cracks and defects are likely to occur. Meanwhile, when the thickness of the organic adhesive layer 8 is greater than 500 μm, the thermal conductivity between the electrostatic chuck section 2 and the temperature adjusting base section 3 cannot be sufficiently secured.

For example, the organic adhesive layer 8 is formed by a hardening body in which a silicone-based resin composition is heated and cured or acrylic resin.

The silicone-based resin composition is a silicon compound having a siloxane bond (Si—O—Si) and having excellent thermal resistance and insulating properties. The silicone-based resin composition can be represented by a chemical formula of formula (1) or formula (2) described below.

[Formula 1]

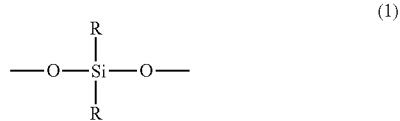
(1)

wherein, R is H or an alkyl group ($C_nH_{2n+1}$-: n is an integer).

[Formula 2]

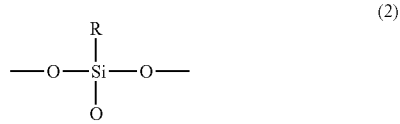
(2)

wherein, R is H or an alkyl group ($C_nH_{2n+1}$-: n is an integer).

As such a silicone resin, particularly, a silicone resin having a thermal curing temperature of 70° C. to 140° C. is preferable. If the thermal curing temperature is lower than 70° C., when bonding the support plate 12 and the heater element 5 of the electrostatic chuck section 2 to the temperature adjusting base section 3 and the insulating member 7 in an opposed state, the curing begins in the bonding process, the workability is degraded, and thus this value is unfavorable. Meanwhile, if the thermal curing temperature is greater than 140° C., the thermal expansion difference between the support plate 12 and the heater element 5 of the electrostatic chuck section 2 and the temperature adjusting base section 3 and the insulating member 7 is great, stress between the support plate 12 and the heater element 5 of the electrostatic chuck section 2 and the temperature adjusting base section 3 and the insulating member 7 is increased, there is a concern that peeling may occur between them, and thus this value is unfavorable.

As the silicone resin, a resin having a Young's modulus of 8 MPa or less after the curing is preferable. If the Young's modulus after the curing is greater than 8 Mpa, when the load of a thermal cycle of a temperature rise and a temperature drop is applied to the organic adhesive layer 8, the thermal expansion difference between the support plate 12 and the temperature adjusting base section 3 cannot be absorbed, the durability of the organic adhesive layer 8 is lowered, and thus this value is unfavorable.

The organic adhesive layer 8 preferably contains a filler selected from an inorganic oxide, an inorganic nitride, and an inorganic oxynitride, for example, surface coated aluminum nitride (AlN) particles having a coating layer formed of silicon oxide ($SiO_2$) on the surfaces thereof, which has an average particle diameter of 1 μm or more and 10 μm or less.

The surface coated aluminum nitride (AlN) particles are mixed for improving the thermal conductivity of the silicone resin, and are able to control the heat transfer coefficient of the organic adhesive layer 8 by adjusting the mixing rate thereof.

That is, by increasing the mixing rate of the surface coated aluminum nitride (AlN) particles, the heat transfer coefficient of the organic adhesive constituting the organic adhesive layer 8 can be increased.

Furthermore, the coating layer formed of silicon nitride ($SiO_2$) is formed on the surface of the aluminum nitride (AlN) particles, and thus has an excellent water resistance compared to simple aluminum nitride (AlN) particles on which the surface coating is not performed. Thus, it is possible to secure the durability of the organic adhesive layer 8 containing the silicone-based resin composition as the main ingredient, and as a consequence, it is possible to dramatically improve the durability of the electrostatic chuck apparatus 1.

Furthermore, the surface coated aluminum nitride (AlN) particles are particles on which the surfaces of the aluminum nitride (AlN) particles are coated by coating layers formed of silicon oxide ($SiO_2$) having excellent water resistance. Therefore, there is no concern that aluminum nitride (AlN) may be hydrolyzed by atmospheric water, and there is no concern that the heat transfer rate of aluminum nitride (AlN) may be lowered, and the durability of the organic adhesive layer 8 is improved.

In addition, the surface coated aluminum nitride (AlN) particles have no fear of becoming a source of pollution to the plate specimen W such as the semiconductor wafer and can also be used as the preferable filler from this point.

Since the surface coated aluminum nitride (AlN) particles can obtain a strong binding state by Si in the coating layer and the silicone-based resin composition, the extensibility of the organic adhesive layer 8 can be improved. As a result, it is possible to alleviate the thermal stress due to a difference in thermal expansion coefficient between the support plate 12 of the electrostatic chuck section 2 and the temperature adjusting base section 3, and it is possible to accurately and fixedly bond the electrostatic chuck section 2 and the temperature adjusting base section 3. Furthermore, since durability with respect to the thermal cycle load during use is sufficient, the durability of the electrostatic chuck apparatus 1 is improved.

The average particle diameter of the surface coated aluminum nitride (AlN) particles is preferably equal to or greater than 1 μm and equal to or less than 10 μm, and more preferably, equal to or greater than 2 μm and equal to or less than 5 μm.

When the average particle diameter of the surface coated aluminum nitride (AlN) particles is lower than 1 μm, there is concern that the contact between the particles may be insufficient, and as a result, the heat transfer rate may be lowered. Furthermore, when the particle diameter is too small, a decrease in workability such as handling is caused and is unfavorable. Meanwhile, when the average particle diameter is greater than 10 μm, a variation is generated in the thickness of the bonding layer, and thus this value is unfavorable.

Furthermore, the organic adhesive layer 8 may be formed of thermosetting acrylic resin adhesive having a Young's modulus is 1 GPa or less and flexibility (a Shore hardness of A100 or less). In this case, the filler may or may not be contained.

Next, a manufacturing method of the electrostatic chuck apparatus 1 will be described.

Firstly, the plate-shaped mounting plate 11 and the support plate 12 are manufactured by an aluminum oxide-silicon carbide ($Al_2O_3$—SiC) composite sintered body or yttrium oxide ($Y_2O_3$) sintered body. In this case, the mixed powders containing the silicon carbide powders and the aluminum oxide powders or the yttrium oxide powders are molded in a desired shape. Thereafter, the mounting plate 11 and the support plate 12 can be obtained by firing the molded article for a predetermined time under a non-oxidizing atmosphere, preferably, an inactive atmosphere, for example, at 1,400° C. to 2,000° C.

Next, a plurality of fixing holes for fitting and holding the power supplying terminal 15 is formed in the support plate 12.

Next, the power supplying terminal 15 is manufactured so as to have a size and a shape that can be closely fixed to the fixing holes of the support plate 12. As the manufacturing method of the power supplying terminal 15, for example, when the power supplying terminal 15 is made of a conductive composite sintered body, a method of molding a conductive ceramic powder to a desired shape to perform the pressing firing or the like is adopted.

At this time, as the conductive ceramic powder used in the power supplying terminal 15, conductive ceramic powder formed of the same material as that of the electrostatic adsorbing internal electrode 13 is favorable.

Furthermore, when the power supplying terminal 15 is made of metal, a method of producing a terminal by a metal processing method such as a grinding method and a powder metallurgy using the high melting-point metal or the like is adopted.

Next, in a predetermined region of the surface of the support plate 12 fitted with the power supplying terminal 15, the electrostatic adsorbing internal electrode forming application liquid, in which the conductive material such as the conductive ceramic powder is dispersed in the organic solvent, is applied so as to come into contact with the power supplying terminal 15, and dried to form the electrostatic adsorbing internal electrode forming layer.

Since there is a need to apply in a uniform thickness, as the application method, it is desirable to use a screen printing method or the like. Furthermore, as another method, there are a method of forming a thin film of the high melting-point metal by the vapor deposition method or the sputtering method, a method of disposing the thin plate formed of the conductive ceramic or the high melting-point metal to form the electrostatic adsorbing internal electrode forming layer or the like.

Furthermore, the insulating material layer containing the powder materials having the same composition and the same main ingredient as those of the mounting plate 11 and the support plate 12 is formed in a region other than the region formed with the electrostatic adsorbing internal electrode forming layer on the support plate 12 so as to improve the insulating properties, the corrosion resistance and the plasma resistance. For example, the insulating material layer can be formed by applying the application liquid, in which the insulating material powder having the same composition and the same main ingredient as those of the mounting plate 11 and the support plate 12 are dispersed in the organic solvent, to the predetermined region by the screen printing or the like, and drying.

Next, the mounting plate 11 is superimposed on the electrostatic adsorbing internal electrode forming layer and the insulating material layer on the support plate 12, and then they are integrated by a hot press under the high temperature and the high pressure. The atmosphere in the hot press is preferably vacuum or an inactive atmosphere such as Ar, He, and $N_2$. Furthermore, the pressure during uniaxial pressurization in the hot press is 5 to 10 MPa, and the temperature thereof is preferably 1,400° C. to 1,850° C.

By the hot press, the electrostatic adsorbing internal electrode forming layer is baked to form the electrostatic adsorbing internal electrode 13 formed of the conductive composite sintered body. At the same time, the support plate 12 and the mounting plate 11 are joined and integrated via the insulating material layer 14.

Furthermore, the power supplying terminal 15 is baked again in the hot press at high temperatures and high pressures, and is fixed closely to the fixing hole of the support plate 12.

Moreover, the upper and lower surfaces of the joining body, the outer circumference, a gas hole or the like are machined to form the electrostatic chuck section 2.

Next, a sheet-like or film-like adhesive resin such as polyimide resin, silicone resin, and epoxy resin, which has the same pattern shape as that of the heater element 5 and has thermal resistance and the insulating properties, is glued to a predetermined region of the surface (a lower surface) of the support plate 12 of the electrostatic chuck section 2, thereby to form the adhesive material 4.

The adhesive material 4 can also be manufactured by gluing the adhesive resin sheet or the adhesive resin film such as polyimide resin, silicone resin, and epoxy resin, which has the thermal resistance and the insulating properties, to the surface (the lower surface) of the support plate 12, and forming the same pattern as that of the heater element 5 in the sheet or the film.

Next, the nonmagnetic metallic thin plate such as, for example, a titanium (Ti) thin plate, a tungsten (W) thin plate, and a molybdenum (Mo) thin plate, which has a constant thickness of a thickness of 0.2 mm or less, preferably, 0.1 mm or less, is glued onto the adhesive material 4, and the nonmagnetic metallic thin plate is etched to a desired heater pattern by the photolithography method to form the heater element 5.

As a result, the electrostatic chuck section with the heater element is obtained in which the heater element 5 having a desired heater pattern is formed on the surface (the lower surface) of the support plate 12 via the adhesive material 4.

Next, the power supplying terminal 22 of a predetermined size and shape is manufactured. As a manufacturing method of the power supplying terminal 22, a method of molding the conductive ceramic powder to a desired shape to perform a press baking, for example, when the power supplying terminal 22 is the conductive composite sintered body, similar to the manufacturing method of the power supplying terminal 15 mentioned above.

Furthermore, when the power supplying terminal 22 is made from metal, a method producing a terminal by the metal processing method or the like such as the grinding method and the powder metallurgy by using the high melting-point metal is adopted.

Then, the metallic material formed of aluminum (Al), an aluminum alloy, copper (Cu), a copper alloy, stainless steel (SUS) or the like is subjected to the machining, a water path or the like is formed, through which water is circulated, in the inner section of the metallic material as necessary, and a fixing hole for fitting and holding the power supplying terminal 15 and the insulator 17 and a fixing hole for fitting and holding the power supplying terminal 22 and the insulator 23 are formed, thereby to form the temperature adjusting base section 3.

It is desirable that at least the surface of the temperature adjusting base section 3 exposed to the plasma be subjected to the alumite processing or an insulating film such as alumina be formed.

Next, the joining surface between the temperature adjusting base section 3 and the electrostatic chuck section 2 is degreased and cleaned, for example, using acetone, and the sheet-like or film-like adhesive resin such as polyimide resin, silicone resin, and epoxy resin, which has the thermal resistance and the insulating properties, is glued to a predetermined position on the joining surface, thereby to form the adhesive material 6.

Next, the sheet-like or film-like resin such as polyimide resin, silicone resin, and epoxy resin having the thermal resistance and the insulating properties and having the same plane shape as that of the adhesive material 6 is glued onto the adhesive material 6, to form the insulating member 7.

Next, in a predetermined region on the temperature adjusting base section 3 on which the adhesive material 6 and the insulating member 7 are stacked, for example, the adhesive material formed of the silicone-based resin composition is applied. The application amount of the adhesive material is in a range of a predetermined amount so that the electrostatic chuck section 2 and the temperature adjusting base section 3 can be joined and integrated by a spacer in the state of holding a constant gap.

As the application method of the adhesive material, in addition to manually applying using a spatula or the like, a bar coating method, a screen printing method or the like are adopted. However, since there is a need to accurately form the adhesive material on a predetermined region on the temperature adjusting base section 3, the screen printing method or the like is preferably used.

After the application, the electrostatic chuck section 2 and the temperature adjusting base section 3 are superimposed via the adhesive material. At this time, the erected power supplying terminal 15 and the insulator 17, and the power supplying terminal 22 and the insulator 23 are inserted and fitted to the power supplying terminal accommodation hole (not shown) punched in the temperature adjusting base section 3.

Next, the electrostatic chuck section 2 and the temperature adjusting base section 3 are contacted by force so that a gap between the electrostatic chuck section 2 and the temperature adjusting base section 3 becomes the same as the thickness of the spacer, and the remaining pressed adhesive is removed.

As mentioned above, the electrostatic chuck section 2 and the temperature adjusting base section 3 are bonded and integrated via the adhesive material 6, the insulating member 7 and the organic adhesive layer 8, whereby the electrostatic chuck apparatus 1 of the present embodiment is obtained.

The electrostatic chuck apparatus 1 obtained in this manner is formed by bonding and integrating the electrostatic chuck section 2, in which the heater element 5 is bonded via the sheet-like or film-like adhesive material 4, and the temperature adjusting base section 3 via the organic adhesive layer 8 and the sheet-like or film-like insulating member 7, and can satisfactorily maintain the insulation between the electrostatic chuck section 2 and the temperature adjusting base section 3. Thus, it is possible to improve the voltage endurance between the electrostatic chuck section 2 and the temperature adjusting base section 3.

Furthermore, since the heater element 5 is bonded to the electrostatic chuck section 2 via the sheet-like or film-like adhesive material 4, the uniformity of the in-plane temperature in the mounting surface of the electrostatic chuck section 2 can be increased, and the voltage endurance of the heater element 5 can be further improved.

Moreover, since the organic adhesive layer 8 is interposed between the electrostatic chuck section 2 bonded with the heater element 5 and the temperature adjusting base section 3, the organic adhesive layer 8 functions as the shock absorbing layer which alleviates the rapid expansion and contraction with respect to the electrostatic chuck section 2, whereby cracks, defects or the like in the electrostatic chuck section 2 can be prevented. Thus, the durability of the electrostatic chuck section 2 can be improved.

EXAMPLES

Hereinafter, the present invention will be specifically described by examples and comparative examples, but the present invention is not limited by the examples.

Example 1

Manufacturing of Electrostatic Chuck Apparatus

The electrostatic chuck section 2 buried with the electrostatic adsorbing internal electrode 13 having a thickness of 20 µm in an inner section thereof was manufactured by a known method.

A mounting plate 11 of the electrostatic chuck section 2 is an aluminum oxide-silicon carbide composite sintered body containing silicon carbide of 8.5% by mass, and has a disk shape with a thickness of 0.5 mm and a diameter of 298 mm. Furthermore, the electrostatic adsorption surface of the mounting plate 11 is made to concave and convex surfaces by forming a plurality of protrusion sections 16 having a height of 40 µm, the top of the protrusion section 16 is a holding surface of the plate specimen W, and a cooling gas can be caused to flow in the groove formed between the concave section and the plate specimen W electrostatically adsorbed.

Furthermore, similar to the mounting plate 11, a support plate 12 is an aluminum oxide-silicon carbide composite sintered body containing silicon carbide of 8.5% by mass, and has a disk shape having a diameter of 298 mm and a thickness of 2 mm.

By joining and integrating the mounting plate 11 and the support plate 12, the entire thickness of the electrostatic chuck section 2 was 2.5 mm.

Meanwhile, a temperature adjusting base section 3 made of aluminum having a diameter of 350 mm and a height of 30 mm was manufactured by the machining. In an inner section of the temperature adjusting base section 3, a flow path (not shown) for circulating the refrigerant was formed.

Furthermore, an angle-shaped spacer having a width of 2,000 µm, a length of 2,000 µm and a height of 200 µm was manufactured by the aluminum oxide sintered body.

Next, the surface (the lower surface) of the support plate 12 of the electrostatic chuck section 2 was degreased and cleaned using acetone, and a sheet adhesive formed of an epoxy resin having a thickness of 20 µm was glued to a predetermined region of the surface to form the adhesive material 4.

Next, a titanium (Ti) thin plate having a thickness of 100 µm was mounted on the adhesive material 4. Next, it was pressurized and maintained at 150° C. in the vacuum, and the electrostatic chuck section 2 and the titanium (Ti) thin plate were bonded and fixed to each other.

Next, a titanium (Ti) thin plate was etched to the heater pattern as shown in FIG. 2 by the photolithography method to form the heater element 5. Furthermore, the power supplying terminal 22 made of titanium was erected on the heater element 5 using the welding method.

As a result, the electrostatic chuck apparatus with the heater element was obtained.

Next, the joining surface between the temperature adjusting base section 3 and the electrostatic chuck section 2 was degreased and cleaned using acetone, a sheet adhesive formed of epoxy resin having the thickness of 20 μm as the adhesive material 6 was glued to a predetermined position on the joining surface, and then, a polyimide film having the thickness of 50 μm as the insulating member 7 was glued onto the sheet adhesive.

Furthermore, the aluminum nitride (AlN) powder were mixed with silicone resin-aluminum nitride (AlN) powder so as to become 20% by volume with respect to the aluminum nitride (AlN) powder, and the mixture was subjected to a stirring defoaming treatment to obtain a silicone-based resin composition.

In addition, the aluminum nitride powder which has a particle diameter of 10 to 20 μm selected by a wet sieve was used.

Next, the silicone-based resin composition was applied on the temperature adjusting base section on which the sheet adhesive and the polyimide film are stacked, by the screen printing method, and then the electrostatic chuck section and the temperature adjusting base section were superimposed via the silicone-based resin composition.

Next, after contacting by force the heater element of the electrostatic chuck section and the temperature adjusting base section so that the gap between them is equal the height of the space of the angle shape, that is 200 μm, the conditions were maintained for 12 hours at 110° C., the silicone resin composition was cured to join the electrostatic chuck section and the temperature adjusting base section, thereby to manufacture the electrostatic chuck apparatus of Example 1.

(Evaluation)

(1) A voltage endurance, (2) an in-plane temperature control and temperature rising and drop characteristics of a silicon wafer, and (3) an in-plane temperature control and temperature rising and drop characteristics of the silicon wafer under a pseudo-plasma heat input were evaluated in the electrostatic chuck apparatus of Example 1 respectively.

(1) Voltage Endurance

Between the temperature adjusting base section 3 and the heater element 5, the voltage was increased in stages by 1 kV from 1 kV, the voltage of the maximum value of 10 kV was applied, and the leakage current in each voltage was measured. Herein, three kinds of electrostatic chuck apparatuses having the thickness of the organic adhesive layer 8 between the temperature adjusting base section 3 and the heater element 5 of 100 μm, 200 μm, and 300 μm were manufactured, and the respective voltage endurances were evaluated.

As a consequence, the leakage current in a case of applying the voltage of 10 kV was equal to or less than 0.1 μA in three types of electrostatic chuck apparatuses, and the considerably satisfactory voltage endurance was shown.

Figure 3:
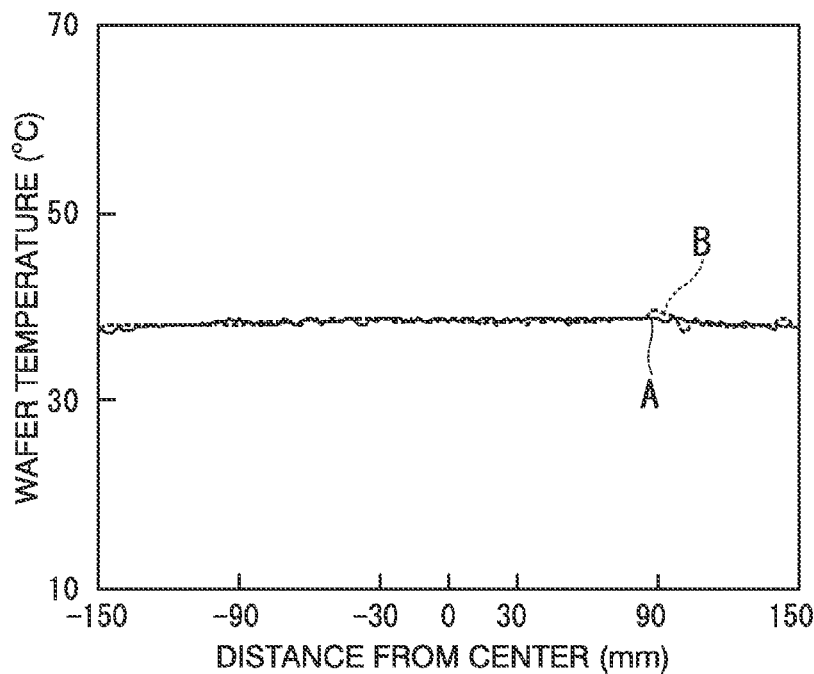
FIG. 3 is a diagram that shows an in-plane temperature distribution of a silicon wafer during cooling in the electrostatic chuck apparatus of an example.

(2) In-Plane Temperature Control and Temperature Rising and Drop Characteristics of Silicon Wafer a. The silicon wafer having a diameter of 300 mm was electrostatically adsorbed to the mounting surface of the electrostatic chuck section 2, the external heater 5b and the internal heater 5a of the heater element 5 was supplied with electricity so that the center temperature of the silicon wafer is 40° C. while circulating the cooling water of 20° C. in the flow path (not shown) of the temperature adjusting base section 3, and the in-plane temperature distribution of the silicon wafer at this time was measured using thermography TVS-200EX (manufactured by Nippon Avionics Co., Ltd.). The result thereof is shown in FIG. 3. In FIG. 3, A shows an in-plane temperature distribution of silicon wafer in one radial direction, and B shows an in-plane temperature distribution of the radial direction orthogonal to the one radial direction of the silicon wafer, respectively. As shown in FIG. 3, the in-plane temperature distribution of Example 1 is ±2° C., and it is clear that the in-plane temperature uniformity of Example 1 is excellent.

Figure 4:
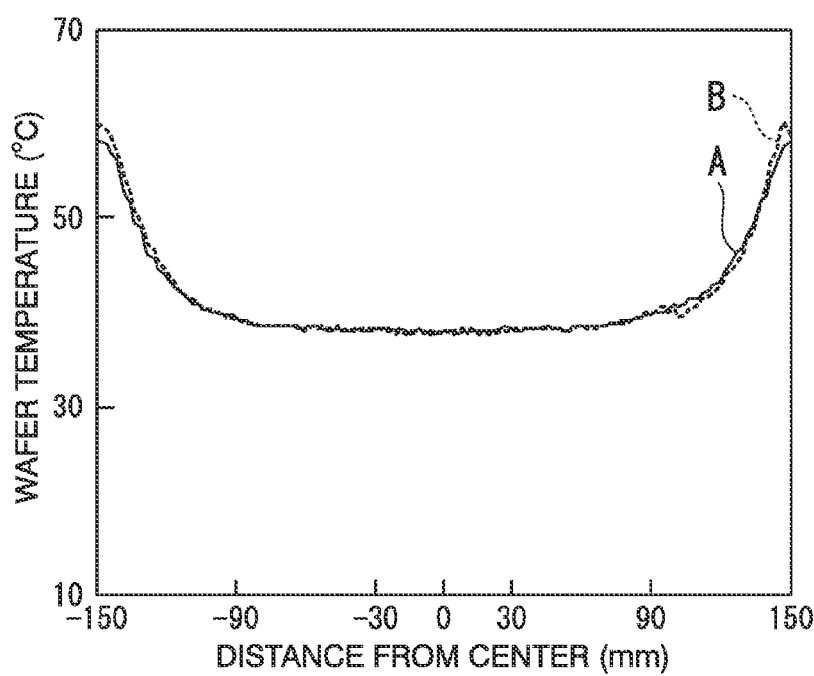
FIG. 4 is a diagram that shows an in-plane temperature distribution of the silicon wafer when being maintained at 50° C. in the electrostatic chuck apparatus of an example.

Next, b. An amount of electric power of the external heater 5b of the heater element 5 was increased, the temperature was increased at a temperature rising speed of 3.6° C./second so that the temperature of the silicon wafer outer circumferential section is 60° C., and the in-plane temperature distribution of the silicon wafer of this time was measured using thermography TVS-200EX (manufactured by Nippon Avionics Co., Ltd.). The result thereof is shown in FIG. 4. In FIG. 4, A shows an in-plane temperature distribution of silicon wafer in one radial direction, and B shows an in-plane temperature distribution of the radial direction orthogonal to the one radial direction of the silicon wafer, respectively.

Figure 5:
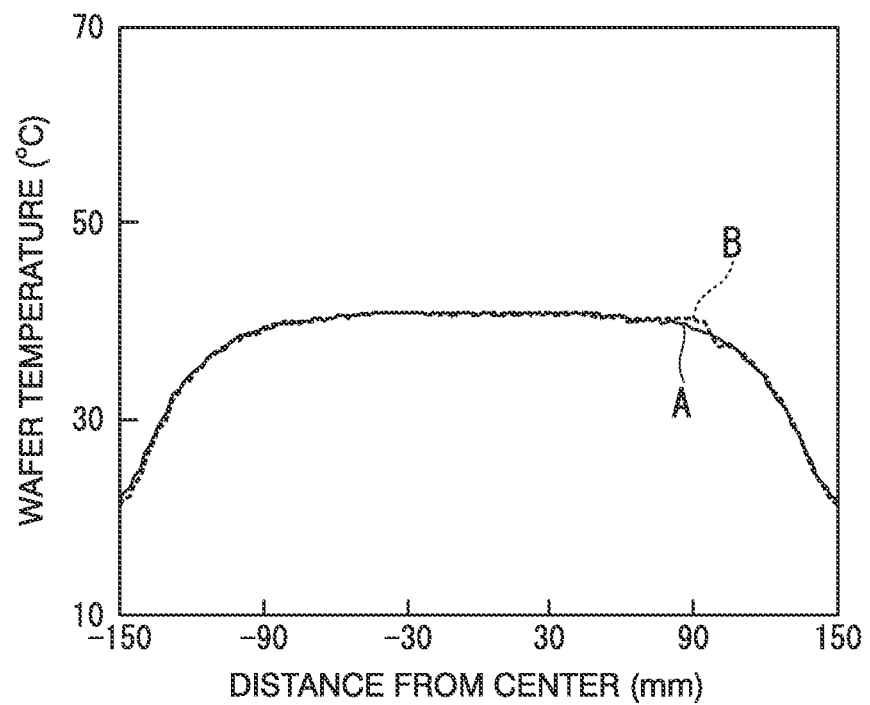
FIG. 5 is a diagram that shows an in-plane temperature distribution of the silicon wafer when the temperature is raised in the electrostatic chuck apparatus of an example.

Moreover, c. The electric conduction of the external heater 5b of the heater element 5 was stopped, the temperature was decreased at a temperature dropping speed of 4.0° C./second so that the temperature of the silicon wafer outer circumferential section is 20° C., and the in-plane temperature distribution of the silicon wafer of this time was measured using thermography TVS-200EX (manufactured by Nippon Avionics Co., Ltd.). The result thereof is shown in FIG. 5. In FIG. 5, A shows an in-plane temperature distribution of silicon wafer in one radial direction, and B shows an in-plane temperature distribution of the radial direction orthogonal to the one radial direction of the silicon wafer, respectively.

According to the measurement results of a to c mentioned above, it was found that the in-plane temperature and temperature rising and drop characteristics of the silicon wafer is preferably controlled within the scope of ±20° C.

(3) In-Plane Temperature Control of Silicon Wafer Under Pseudo-Plasma Heat Input The electrostatic chuck apparatus 1 was fixed within a vacuum chamber, and the in-plane temperature of the silicon wafer under the pseudo plasma heat input was measured. Herein, as the pseudo plasma heat input, the heating was performed by using an external heater which is arranged above the mounting surface of the electrostatic chuck apparatus 1 by 40 mm and is a sheet heater with a diameter of 300 mm, and in which the heating value of the outer circumferential section is greater than that of the inner section thereof. In addition, He gas at a pressure of 30 torr was caused to flow in a groove formed between the silicon wafer and the electrostatic adsorption surface of the electrostatic chuck section 2.

Herein, the silicon wafer having a diameter of 300 mm was electrostatically adsorbed to the mounting surface of the electrostatic chuck section 2, and the internal heater 5a of the heater element 5 was supplied with electricity so that the temperature of the entire region of the silicon wafer is 40° C. while circulating the cooling water of 20° C. in the flow path (not shown) of the temperature adjusting base section 3.

Next, d. the external heater 5b was also supplied with electricity while maintaining the electrical conduction state. When the in-plane temperature of the silicon wafer of this time was measured by a thermocouple, the temperature of the center section of the silicon wafer was 60° C., and the temperature of the outer circumferential section of the silicon wafer was 70° C.

Next, e. The electric conduction amount of the external heater 5*b* of the heater element 5 was lowered while maintaining the electrical conduction between the internal heater 5*a* and the external heater 5*b* of the heater element 5. When the in-plane temperature of the silicon wafer of this time was measured by a thermocouple, the temperature was constantly 60° C. in the entire region of the silicon wafer.

According to the measurement results of d to e mentioned above, under the pseudo plasma heat input, it was also found that the in-plane temperature of the silicon wafer is preferably controlled within the scope of 10° C.

Example 2

Manufacturing of Electrostatic Chuck Apparatus

The electrostatic chuck apparatus of Example 2 was manufactured similar to Example 1, except that the mounting plate 11 and the support plate 12 of the electrostatic chuck section 2 were the yttrium oxide sintered body, and the electrostatic adsorbing internal electrode 13 was the yttrium oxide-molybdenum conductive composite sintered body.
(Evaluation)

The electrostatic chuck apparatus of Example 2 was evaluated according to Example 1.

As a consequence, in (1) the voltage endurance, the leakage current in a case of applying the voltage of 10 kV or 4 kV was equal to or less than 0.1 μA, and showed the extremely satisfactory voltage endurance. In (2) the in-plane temperature control of the silicon wafer and the temperature rising and drop characteristics, it was found that the in-plane temperature of the silicon wafer is preferably controlled within a range of ±20° C. Furthermore, in (3) in the in-plane temperature of the silicon wafer under the pseudo plasma heat input, it was also found that the in-plane temperature of the silicon wafer is preferably controlled within range of 10° C.

Comparative Example 1

Manufacturing of Electrostatic Chuck Apparatus

An electrostatic chuck apparatus of Comparative Example 1 was manufactured similar to Example 1, except that the adhesive material formed of the viscous liquid epoxy resin was applied to a predetermined region of the surface (the lower surface) of the support plate 12 of the electrostatic chuck section 2 to form the adhesive layer, and a titanium (Ti) thin plate of a thickness of 100 μm was bonded and fixed onto the adhesive layer.
(Evaluation)

The electrostatic chuck apparatus of comparative example 1 was evaluated according to Example 1.

As a consequence, in (1) the voltage endurance, the leakage current in a case of applying the voltage of 10 kV or 4 kV was equal to or less than 0.5 μA, and showed the extremely satisfactory voltage endurance, but in (2) the in-plane temperature distribution, which is measured when the center temperature of the silicon wafer is 40° C. while circulating the cooling water of 20° C. (that is, the step a), was in the range of ±5.0° C., and the in-plane temperature uniformity was lowered. Compared with the results shown in FIG. 3, which shows the in-plane temperature uniformity of Example 1 is ±2.0° C., the in-plane temperature of the silicon wafer of comparative example 1 was inferior. Furthermore, in (3) the in-plane temperature of the silicon wafer is in the range of ±5.0° C., and the in-plane temperature uniformity was lowered.

Comparative Example 2

Manufacturing of Electrostatic Chuck Apparatus

An electrostatic chuck apparatus of Comparative Example 2 was manufactured similar to Example 1, except that the sheet adhesive and the polyimide film were not sequentially glued onto the joining surface between the electrostatic chuck section 2 and the temperature adjusting base section 3.
(Evaluation)

The electrostatic chuck apparatus of Comparative Example 1 was evaluated according to Example 1.

As a consequence, in (1) the voltage endurance, when the thickness of the organic adhesive layer 8 between the temperature adjusting base section 3 and the heater element 5 was 100 μm, the discharge is generated at 2.6 kV to 7 kV. When the thickness was 200 μm, the discharge was generated at 10 kV. When the thickness is 300 μm, the discharge was not generated at 10 kV. As a consequence, when the thickness of the organic adhesive layer 8 was 300 μm, extremely satisfactory voltage endurance was shown. However, when the thickness was equal to or less than 200 μm, the discharge was generated at 10 kV or less, and the voltage endurance was lowered.

Meanwhile, in (2) the in-plane temperature control of the silicon wafer and-the temperature rising and drop characteristics, it was found that the in-plane temperature of the silicon wafer was satisfactorily controlled in the range of ±20° C., and the in-plane temperature uniformity was improved. Furthermore, in (3) the in-plane temperature control of the silicon wafer and the temperature rising and drop characteristics under the pseudo plasma heat input, it was also found that the in-plane temperature of the silicon wafer was satisfactorily controlled in the range of 10° C., and the in-plane temperature uniformity was improved.

REFERENCE SIGNS LIST

1: electrostatic chuck apparatus
2: electrostatic chuck section
3: temperature adjusting base section
4: adhesive material
5: heater element
5*a*: internal heater
5*b*: external heater
6: adhesive material
7: insulating member
8: organic adhesive layer
11: mounting plate
12: support plate
13: electrostatic adsorbing internal electrode
14: insulating material layer
15: power supplying terminal
16: protrusion section
17: insulator
21: connection position of power supplying terminal
22: power supplying terminal
23: insulator
W: plate specimen

The invention claimed is:

1. An electrostatic chuck apparatus including:
an electrostatic chuck section having one main surface that is a mounting surface on which a plate specimen is mounted, and being equipped with an electrostatic adsorbing internal electrode; and a temperature adjusting base section that adjusts the electrostatic chuck section to a desired temperature, wherein a heating member is bonded to a main surface of the electrostatic chuck section, which is opposite to the mounting surface, via an adhesive material, the heating member and the adhesive material having a predetermined pattern of the same shape, the whole or a part of the main surface of the temperature adjusting base section, which is on the side of the electrostatic chuck section, is covered with a sheet or film of insulating material made of a resin having insulating properties and voltage endurance, and the electrostatic chuck section bonded with the heating member and the temperature adjusting base section covered with the sheet or film of insulating material are bonded and integrated via an insulating organic adhesive layer formed by curing a liquid adhesive.

2. The electrostatic chuck apparatus according to claim 1, wherein the sheet or film of insulating material is bonded to the temperature adjusting base section by a sheet or film of adhesive material.

3. The electrostatic chuck apparatus according to claim 1 or 2,
wherein a thickness of the electrostatic chuck section is equal to or greater than 0.7 mm and is equal to or less than 3.0 mm.

4. The electrostatic chuck apparatus according to claim 1 or 2,
wherein the heating member is a thin plate-shaped heater element formed from a nonmagnetic metal having a thickness of 0.2 mm or less.

5. The electrostatic chuck apparatus according to claim 1 or 2,
wherein the adhesive material is a silicone or acrylic adhesive material.

6. The electrostatic chuck apparatus according to claim 1 or 2,
wherein a variation of the thickness of the adhesive material is equal to or less than 10 μm.

7. The electrostatic chuck apparatus according to claim 1 or 2,
wherein the electrostatic chuck section includes a mounting plate having one main surface as the mounting surface, a support plate which is integrated with the mounting plate to support the mounting plate, and the electrostatic adsorbing internal electrode provided between the mounting plate and the support plate, and the mounting plate is formed of an aluminum oxide-silicon carbide composite sintered body or a yttrium oxide sintered body.

8. The electrostatic chuck apparatus according to claim 7, wherein the thickness of the mounting plate is equal to or greater than 0.3 mm and equal to or less than 2.0 mm.

* * * * *